(12) United States Patent
Davis et al.

(10) Patent No.: US 7,495,942 B2
(45) Date of Patent: Feb. 24, 2009

(54) NANOSCALE CONTENT-ADDRESSABLE MEMORY

(75) Inventors: Bryan Davis, Gainesville, FL (US); Jose C. Principe, Gainesville, FL (US); Jose Fortes, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 11/573,630

(22) PCT Filed: Aug. 15, 2005

(86) PCT No.: PCT/US2005/028928

§ 371 (c)(1),
(2), (4) Date: Aug. 9, 2007

(87) PCT Pub. No.: WO2006/137833

PCT Pub. Date: Dec. 28, 2006

(65) Prior Publication Data

US 2007/0291524 A1 Dec. 20, 2007

Related U.S. Application Data

(60) Provisional application No. 60/601,347, filed on Aug. 13, 2004.

(51) Int. Cl.
*G11C 15/00* (2006.01)
(52) U.S. Cl. ..................... 365/49.1; 365/151
(58) Field of Classification Search ............ 365/69, 365/49.1, 151, 230.03
See application file for complete search history.

(56) References Cited

U.S. PATENT DOCUMENTS

| 6,128,214 | A | 10/2000 | Kuekes et al. | |
|---|---|---|---|---|
| 6,256,767 | B1 | 7/2001 | Kuekes et al. | |
| 6,466,512 | B1 | 10/2002 | Hogan et al. | |
| 6,898,098 | B2 * | 5/2005 | Snider et al. | 365/49.18 |
| 7,073,157 | B2 * | 7/2006 | DeHon et al. | 716/17 |
| 2004/0151012 | A1 | 8/2004 | Snider et al. | |
| 2006/0161876 | A1 * | 7/2006 | DeHon et al. | 716/17 |

FOREIGN PATENT DOCUMENTS

| WO | WO 03/063208 | 7/2003 |
|---|---|---|
| WO | WO 2004/061859 | 7/2004 |

OTHER PUBLICATIONS

Davis, Design and Performance of Nanoscale Content-Addressable Memories/NanoCAM: A Content-Addressable Memory built from Nano-Scale Components, Comput. NeuroEngineering Lab. Seminar (Feb. 11, 2004); retrieved from www.cnel.ufl.edu/files/1076965025.ppt.
Davis et al., Design and performance analysis of a novel nanoscale associative memory, Nanotechnology, 4th IEEE Conf., Munich, Germany (Aug. 16-19, 2004), pp. 314-316.
Glosekotter et al., Associative matrix for nano-scale integrated circuits, Microelectronics for Neural, Fuzzy and Bio-inspired Systems, Microneuro '99 Proc. of the 7th Int'l Conference on Granada, Spain, Los Alamitos, CA, USA (Apr. 7-9, 1999), pp. 352-358.

* cited by examiner

*Primary Examiner*—Tan T. Nguyen
(74) *Attorney, Agent, or Firm*—Akerman Senterfitt; Gregory A. Nelson; Andrew C. Gust (57) ABSTRACT

A combined content addressable memory device and memory interface is provided. The combined device and interface includes one or more one molecular wire crossbar memories having spaced-apart key nanowires, spaced-apart value nanowires adjacent to the key nanowires, and configurable switches between the key nanowires and the value nanowires. The combination further includes a key microwire-nanowire grid (key MNG) electrically connected to the spaced-apart key nanowires, and a value microwire-nanowire grid (value MNG) electrically connected to the spaced-apart value nanowires. A key or value MNGs selects multiple nanowires for a given key or value.

20 Claims, 7 Drawing Sheets

NANOSCALE CONTENT-ADDRESSABLE MEMORY

CROSS-REFERENCE TO RELATED APPLICATIONS

This application is a §371 national stage entry of International Application No. PCT/US2005/028928, filed Aug. 15, 2005, which claims priority to U.S. Provisional Application No. 60/601,347, filed Aug. 13, 2004, both of which are hereby incorporated by reference.

STATEMENT REGARDING FEDERALLY SPONSORED RESEARCH OR DEVELOPMENT

This invention was made with government support under NASA grant no. NCC2-1363 and National Science Foundation grant no. EIA0135946. By virtue of that support, the government has certain rights in this invention.

FIELD OF THE INVENTION

This invention relates to the field of electronic memory devices, and, more particularly, to electronic memory devices having nanoscale functional dimensions.

BACKGROUND OF THE INVENTION

Nanotechnology broadly encompasses materials and devices whose functional dimensions are in nanometers, as well as the bottom-up techniques of manufacturing such materials and devices. The new materials include, for example, carbon nanotubes and semiconducting nanowires. Nanotechnology is viewed by many as being the most promising area of research aimed at overcoming the physical constraints that have hampered development of devices (e.g., computer memory cells) smaller than the current micrometer-sized ones now widely available. Nanotechnology may hold the promise of redirecting the technology road map for CMOS based VLSI design and creating new trends in computer architecture.

A fundamental challenge remains, however, regarding how to interface nanometer-sized components to present micrometer sized devices. Difficulties arise in achieving a satisfactory interface not only because of the scale mismatch, but also because conventional device techniques are based on miniaturizing a precise interconnect and device geometry (top down), while at the nanometer scale designers have to cope with less precise geometry and/or location of components.

These difficulties are seen, for example, in U.S. Pat. No. 6,128,214 (the '214 patent) and U.S. Pat. No. 6,256,767 (the '767 patent), both to Kuekes, et al., which disclose a molecular wire crossbar memory (MWCM) and a demultiplexer for a molecular wire crossbar network (MWCN DEMUX), respectively. The MWCM disclosed by Kuekes, et al. is a conventional listing type memory, albeit, at a nanoscale, utilizing an array of nanometer-sized conducting and semiconducting wires ("nanowires"). The demultiplexer disclosed by Kuekes, et al. is a MWCN DEMUX utilizing a two-dimensional array of nanometer-sized switches, each of which comprises a pair of crossed wires forming a junction and a least one "connector species" comprising a bi-stable molecule.

One apparent difficulty with a MWCM is that a direct, one-to-one connection of its nanometer-sized input and output buses to a micrometer-sized component would likely consume more area on a chip than the MWCM itself, thus possibly undercutting the very advantage of the nanometer-sized component. The MWCN DEMUX address this problem by lithographically connecting micrometer-sized wire to the MWCM nanometer-sized input and output wires. Currently available lithography techniques, however, can make unique addressing of each nanowire problematic. One possible solution is searching the address space of the demultiplexer to determine the addresses that uniquely correspond to each nanowire. Such an approach for a device comprising M microwires and N nanowires, however, requires M×N searches, which typically results in a large number of searches being performed. Moreover, once the addresses are determined, they typically must be stored in micrometer-sized circuitry external to the MWCM.

SUMMARY OF THE INVENTION

The present invention provides a memory device based on a content-associative memory (CAM) architecture whose functional dimensions are in nanoscale. More particularly, the invention provides a combined content addressable memory and memory interface device that can include at least one molecular wire crossbar memory (MWCM) having spaced-apart key nanowires, spaced-apart value nanowires adjacent to the key nanowires, and configurable switches positioned between and connected to the key nanowires and the value nanowires. Each such configurable switch serves as a memory element. A configurable switch may be a bi-stable molecule. A configurable switch may be reconfigurable.

The interface can be a key microwire-nanowire grid (key MNG) electrically connected to the spaced-apart key nanowires. The interface can include a second MNG, which provides a value microwire-nanowire grid (value MNG) electrically connected to the spaced-apart value nanowires. Moreover, both the key and value microwires, according to a particular embodiment, are logically grouped into pairs, with the external control circuitry ensuring that the microwire activations within each pair are complementary. A complementary pair of microwires is a logic pair that always has complementary logic values, such as [0, 1] and [1,0]. As constructed, the device is able to directly implement a Lern-Matrix, which is described below.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

Content Addressable Memory

The present invention is directed to a content addressable memory (CAM) having functional dimensions in nanoscale. A CAM, generally, is a type of memory structure very different from conventional computer (listing) memory. CAMs store globally (in the weights of the CAM) vectors of items, instead of one item per memory location. It does not require addressing because the content is retrieved by presenting one of the inputs used during training of the memory. CAMs have been very useful, for example, in cognitive science because they resemble many of the properties of human memory (recall by content, error robustness, and finite storage). Other applications are found in computer networking and neural networks. Mathematically, CAMs can be understood in terms of vector/matrix operations in vector spaces, and in CAMs the number of stored items is less than the capacity of the network. Therefore, the output of the network, instead of generalizing, reproduces ("remembers") the input data patterns. The distributed characteristics of CAMs as well as their robustness to noise in the weights or inputs are, according to the present invention, a fundamental tool to link the nanoscale, characterized by millions of imprecise elements, to the well organized and patterned microscale devices found, for example, in a CMOS chip design.

Computer memories can be divided into two classes depending on the mechanism used to store and access data. Listing memories, such as RAM found in von Neumann machines, use an address space that has a one-to-one mapping with storage locations in the memory. This means that each address has a unique storage location associated with it. Content Addressable Memories (CAMs), on the other hand, have an address space that is typically much larger than the storage capacity of a device. In addition, data is typically stored in a distributed fashion throughout the memory, instead of in a particular location. Because of this property, the address of a memory item in a CAM is referred to as its key, to distinguish it from the physical address found in listing memories. For clarity, the term value is used herein to denote the data associated with a particular key. This decoupling of the size of the key space and the storage capacity of the memory is useful whenever it is desirable to recall from memory all information associated with an item but when only partial information about the item is given.

One way to construct a CAM is to build an association matrix A with the correspondence between the keys $x_i$ and the data patterns $y_i$ explained below. To retrieve information, the key $x_i$ is presented to the CAM and is multiplied by A to yield the stored data $y_i$, i.e., $y_i = Ax_i$, for each item i. Alternatively, the CAM can be represented mathematically as Y=AX, where X=[$x_i$], and Y=[$y_i$]. If the inverse of X exists, then A=YX$^{-1}$. This is one way to construct the A matrix. In general, the matrix inverse will not exist, but in lieu thereof, the pseudo-inverse X$^+$ of X can be used, which yields the least squares approximation Y'=(YX$^+$)X of Y. If the key matrix X is full rank—that is, if the set of inputs $x_i$ are linearly independent, as will be understood by one skilled in the art—then all the elements of the A matrix can be computed locally using the outer product rule A=YX$^T$, which is equivalent to Hebbian learning between the input and output. In neural networks, even when the matrix X is not full rank, the elements of A are computed locally, though a cross talk error is likely to occur.

The above method operates on real-valued data. It is possible to use binary values for the address and data, but the pseudoinverse or the outer product will still contain non-integers, which requires either analog computation, or floating-point representation in a digital computer (neither of which are currently feasible in the nanoscale). A known type of matrix is the so-called LernMatrix, represented here as the matrix A. It can be determined by taking an outer-product of the key and data matrices X and Y using Boolean arithmetic: A=YX$^T$. To recall the data, first calculate the matrix Z=AX=YX$^T$X. If the elements in each column of Z are less than the number of 1s in the corresponding column of X, then the recalled value for that element should be 0; otherwise, it should be 1. An advantage of using this approximation is that both calculating and representing the matrix in hardware are greatly simplified, as no real-valued data needs to be stored.

Calculation of the information storage capacity of the LernMatrix can be made using the idea of mutual information between the key and the recalled data. It turns out that the number of items that can be stored with accurate recall decreases rapidly as the key and value have a higher percentage of 1s; that is, as the data's sparseness decreases. Because errors increase the uncertainty in the value when the key is known, they decrease the mutual information; however, the information contained in the value increases as the sparseness decreases. The sparseness that results in the highest mutual information between the key and the value can be found corresponding to an optimal number of 1s for a given memory size. It is desirable to keep the number of 1s in each address constant because it simplifies the threshold operation during recall.

Molecular-Wire Crossbar Memory

Figure 1:
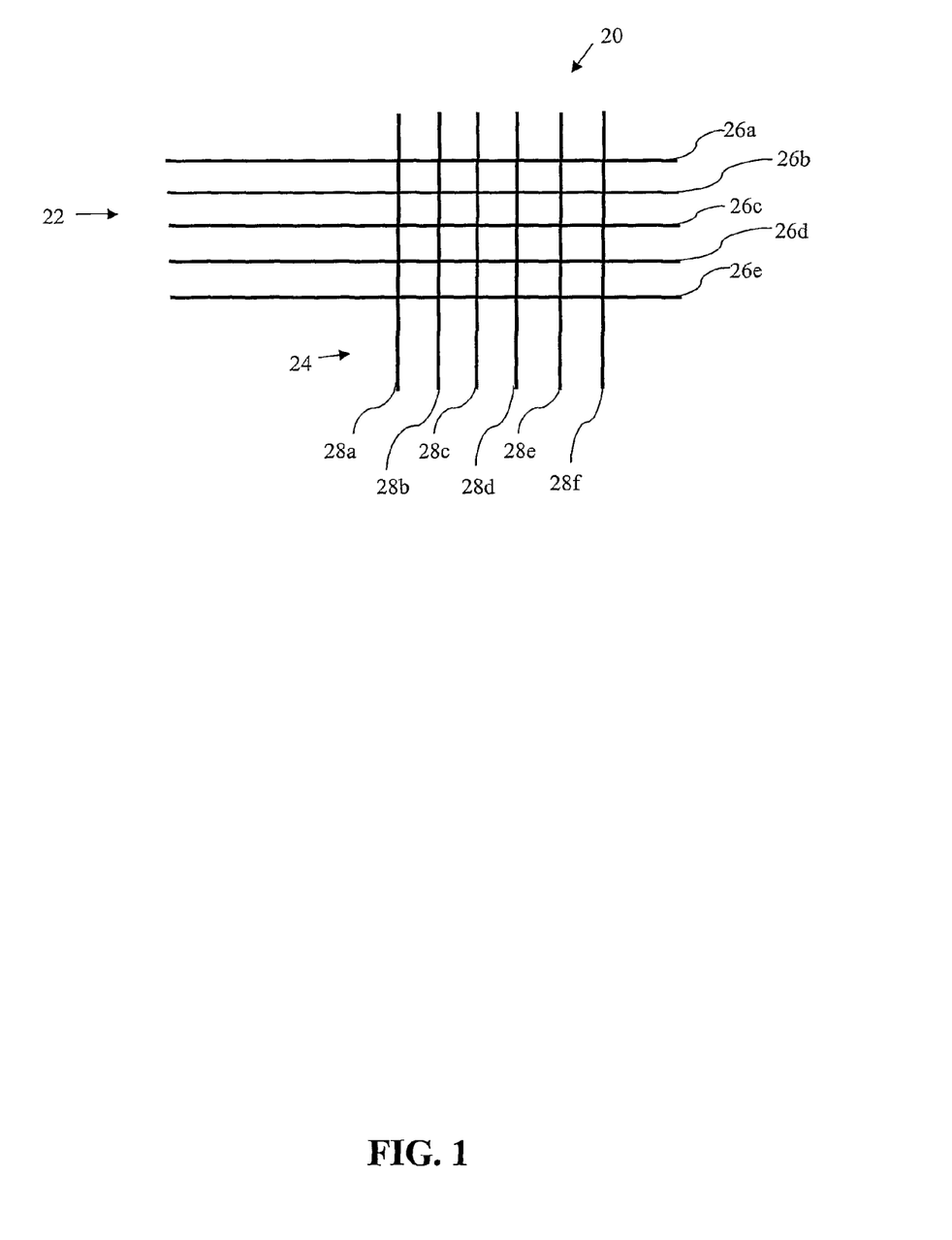
FIG. 1 is a schematic view of a molecular wire crossbar switch, according to an embodiment of the present invention.

Referring now to FIG. 1, the structure of a MWCM according to an embodiment of the present invention is shown as a cross array of wires 20. The array, as illustrated, includes two sets of wires 22, 24 whose functional dimensions of width are nanoscaled and which are referred to herein as "nanowires." Each of the nanowires may be either conducting or semiconducting wires as will be readily understood by those skilled in the art. The two sets of nanowires 22, 24 illustratively lie in separate planes, spaced apart from and not directly touching or electrically coupled to one another. One set 22 of nanowires, as explained in more detail hereinafter, defines a set of key nanowires, and the other set 24 defines a set of value nanowires.

Within a layer a plurality of switches (not shown) can extend between the crossing nanowires. The switches connect to the plurality of key nanowires and value nanowires. Each such switch, as will be readily understood by those skilled in the art, may be a bi-stable molecule defining a memory element, or any molecule or device that could perform the same function. The bi-stable molecule disclosed in the '214 patent to Kuekes, et al., above, is hereby incorporated by reference into the present invention.

Each crossing of two nanowires through a molecular switch thus forms a configurable junction whose properties depend on the geometry and materials of the nanowires and the molecular switch. The geometry and materials, in turn, determine the chemical state of the junction as well as its chemical and physical properties, as will also be readily understood by those skilled in the art. Modifying the chemical state of the junction can change its electrical conductivity. For example, applying a relatively large potential difference between the two nanowires can modify the chemical state of the junction such that the junction's electrical conductivity changes. Alternately, as also will be readily understood by those skilled in the art, an electric current can be used to modify the chemical state of the junction. Other stimuli could be utilized as well. For example, a laser or photo-optic device could be used to modify or change the chemical state of the junction. Additionally, the chemical state of the junction could also be changed, for example, by a heat differential or other physical stimulus, as will be readily appreciated by those skilled in the art. Depending on the materials used in construction, each switch may be reconfigurable; that is, it is possible to construct the switches so that at least one changes back and forth between two states.

Figure 2:
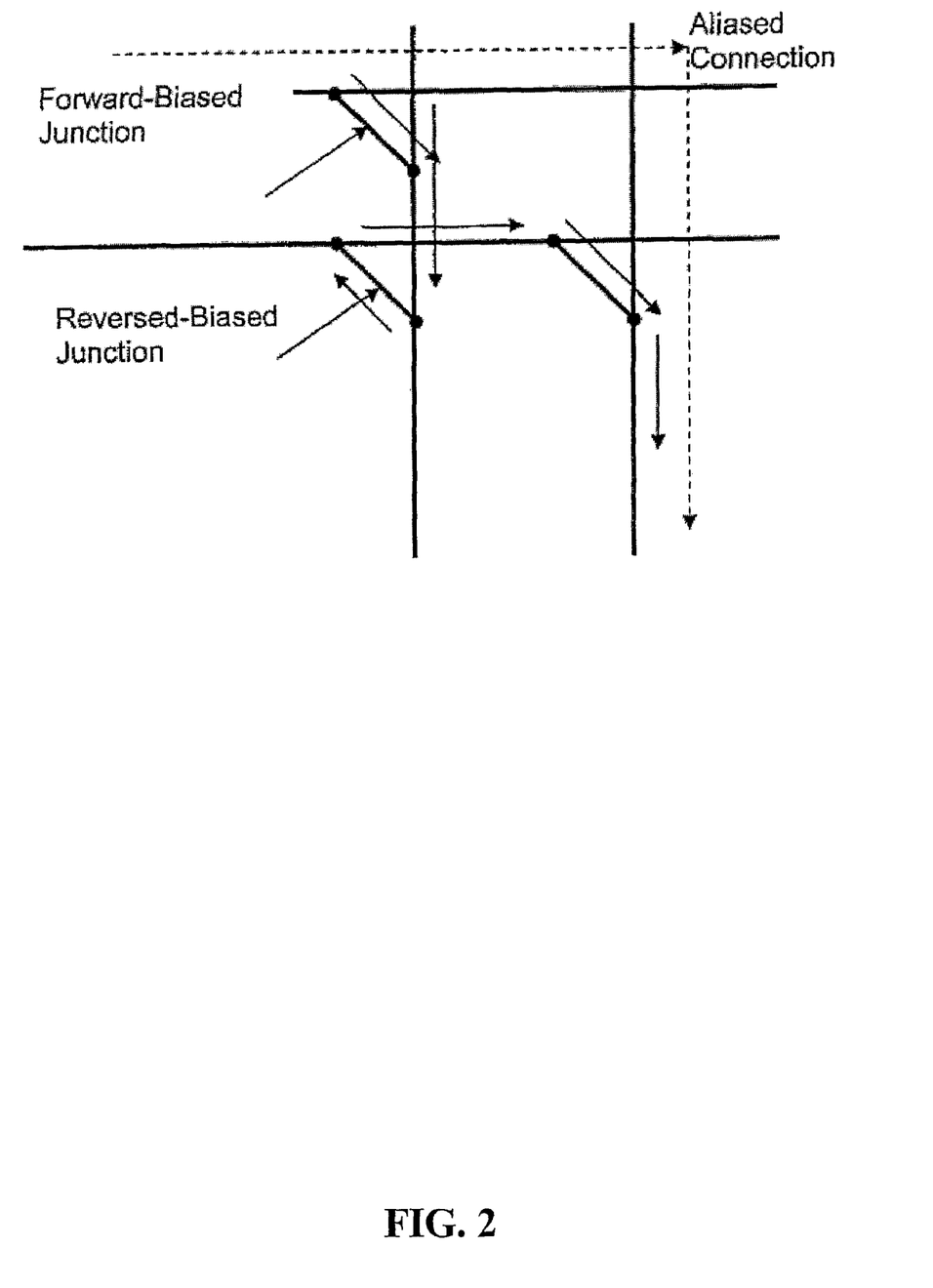
FIG. 2 is a schematic view an aliased connection that can occur in a conventional molecular crossbar switch comprising symmetric junctions and that is avoided by use of switches according to the present invention.

The junction, as characterized by its current-voltage (I-V) relationship in the operating range, may either be symmetric (as with a resistor) or asymmetric (as with a diode). Thus, the junction may be linear, exponential, or, it may exhibit negative differential resistance indicative of resonant tunneling current, as will be readily understood by those skilled in the art. For digital memory applications, it is desirable that the MWCM junctions be highly asymmetric. Otherwise alternate pathways between two nanowires can exist, and indeed dominate the conductance between a pair of nanowires, as illustrated by an aliased connection shown schematically in FIG. 2.

The MWCM can be thought of as an M×N-bit random-access memory, where M is the number of horizontal input wires, and N is the number of vertical output wires. In order to read the memory, the operating potential, which should be lower than the voltage required to change the state of the reconfigurable junction, is applied to one of the M input wires, with the other input lines being disconnected, and the output wires being grounded. The current at each of the grounded output wires is read in series, reading one bit at a time, where the magnitude of the current is used to determine whether the junction is in a conductive state (1) or a non-conductive state (0). In order to write to the memory, exactly one input wire is grounded, and each of the output wires is connected to either a positive or a negative potential that is sufficient to reconfigure the junction as either conducting or non-conducting.

Figure 3:
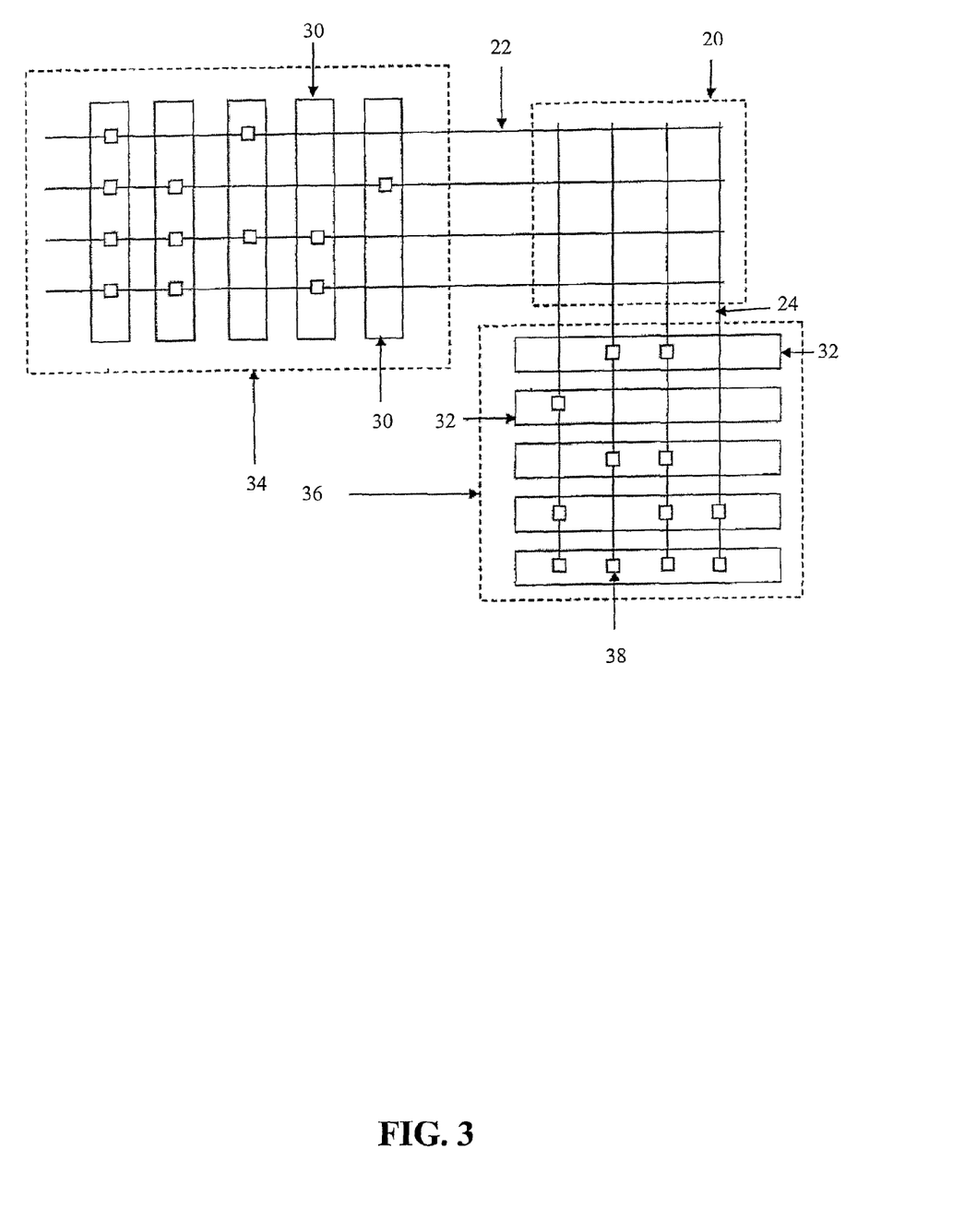
FIG. 3 is a schematic view a molecular wire crossbar switch connected to microscale components via randomly connected demultiplexers, according to an embodiment of the present invention.

A difficulty with the conventional MWCM is that the connections to the input and output buses are in the nanoscale, and direct one-to-one connections to the microscale components are likely to consume more surface area of a memory chip than the MWCM itself. Thus, some of the advantages of using a nanoscaled MWCM are sacrificed. To address this problem, a demultiplexer that connects lithographically-placed microscale wires 30, 32 to the input and output nanowire buses 22, 24 of the MWCM 20 is required, as schematically illustrated in FIG. 3. As explained below, the first set of microwires 30 define key microwires that form a key mirowire/nanowire grid (key MNG) 34 and the second set of microwires 32 define value microwires that form a value microwire/nanowire (value MNG) 36. A junction 38 is formed at some of the microwire/nanowire crossings a junction 38 is formed, but not at others.

Figure 4:
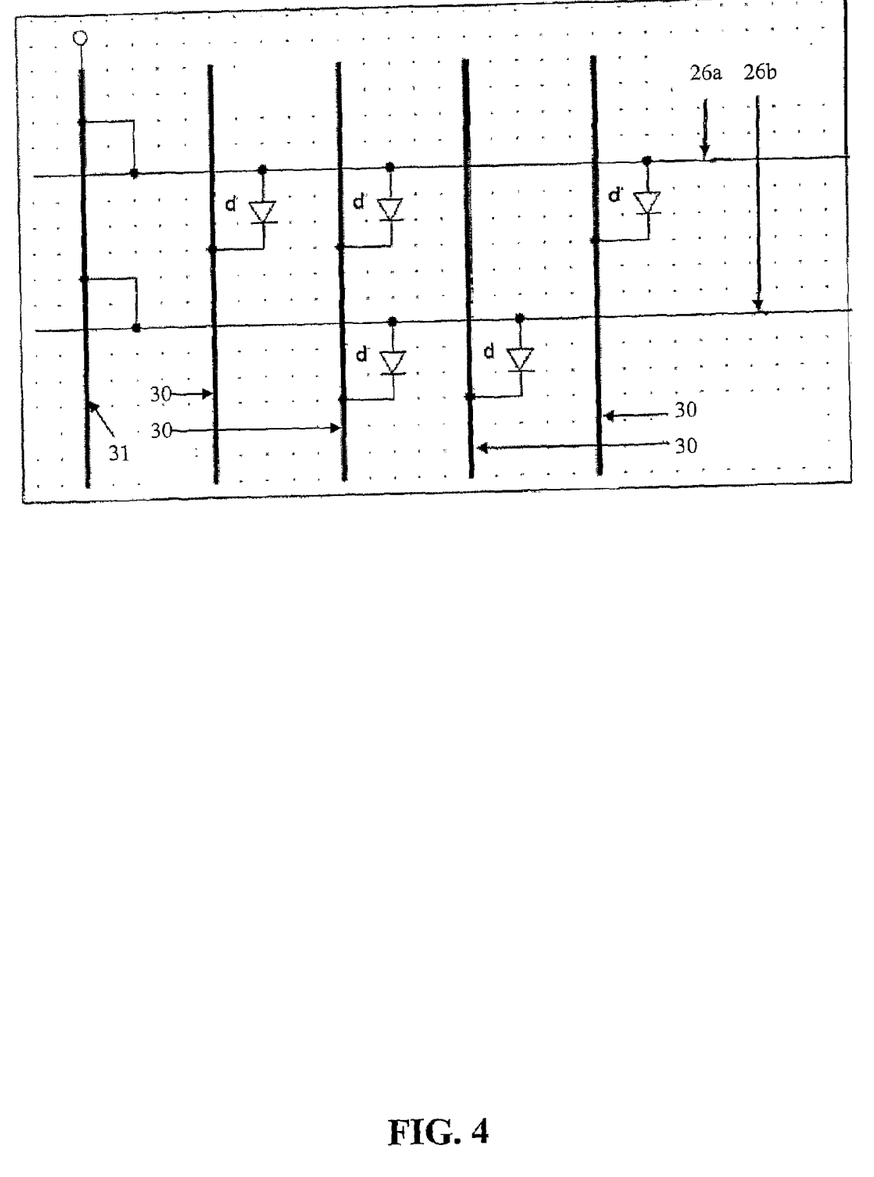
FIG. 4 is a schematic view a molecular wire crossbar memory implemented with diodes at the junctions of the address lines and nanowires, according to an embodiment of the present invention.
Figure 5:
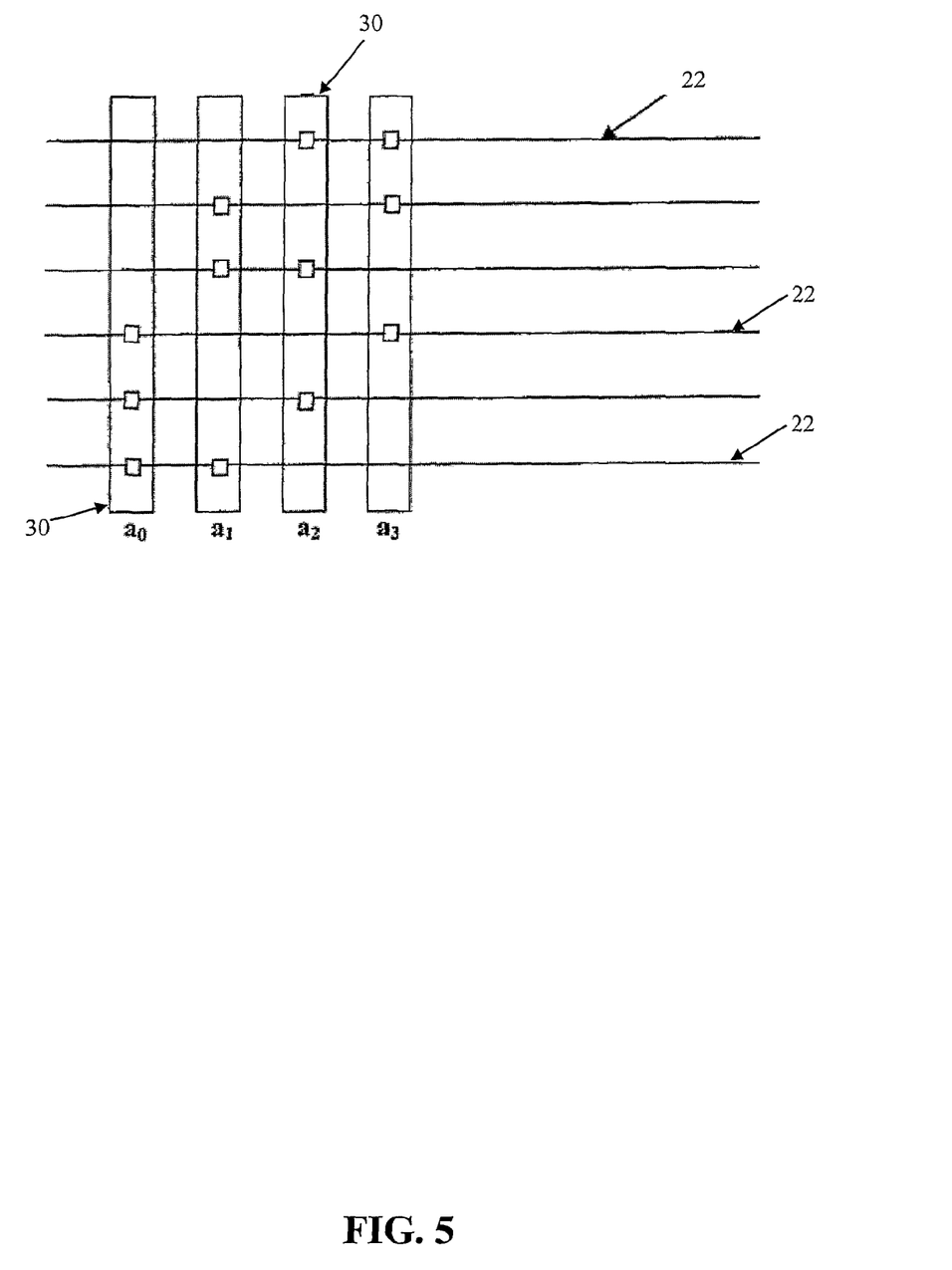
FIG. 5 is a schematic view nanowires uniquely addressed using four microwires, according to an embodiment of the present invention.

Junctions between the microwires and the nanowires may be configured as electrically controlled switches (e.g. transistors) or diodes. A driver (i.e., a microwire or other structure that is permanently connected to the nanowires with a low-resistance junction), is required to "pull-up" (or "pull-down," depending on the polarity) the potential of the nanowire to provide a current as shown in FIG. 4. When the potential difference across the junctions (d) connected to a nanowire 26a, 26b is zero, then the nanowire will be at the same potential as a microwire driver 31 and, the nanowire, accordingly, is selected. Conversely, when any of the junctions connected to the nanowire has a significant potential drop across it, the nanowire will have a potential less than the driver, and will thus be unselected. In order for the microwire/nanowire array to behave as a demultiplexer, only a fraction of the microwire/nanowire junctions should connect the nanowire 26a, 26b to the microwire driver 31. The junctions that are connected can be chosen in such a way that, with a sufficient number of microwires, it is possible to uniquely address each nanowire, as shown in FIG. 5. But at the desired nanoscale, lithography and other manufacturing techniques make it difficult if not impossible to specify exactly which junctions should behave as transistors.

It is possible to specify the probability that a junction is connected by controlling the surface density of the connecting molecules in the layer between the microwires and nanowires. The connecting molecules can be placed randomly on the connecting layer, thus whether there is a connection at a specific location will be an independent, identically distributed (i.i.d.) random event with known mean value. If a sufficient number of microwires are used in the demultiplexer, then it is likely that there will be addresses that will uniquely select each of the individual nanowires. A known method searches the address space of the demultiplexer to determine the addresses that address a unique nanowire. This search takes MN current comparisons, where M is the number of microwires, and N is the number of nanowires. Once these addresses are found, however, they are conventionally stored in microscale circuitry external to the MWCM. The stochastic modeling according to the invention avoids this search and storage step.

Nanoscale CAM

The present invention provides a CAM memory that applies intrinsic error correcting properties to remedy defects in the matrix or noise in the inputs. The content-associative memory architecture described herein comprises a core nanoscale molecular-wire crossbar memory (MWCM) that directly implements the LernMatrix described above. The MWCM very naturally implements the LernMatrix if one is able to access and read-out current and voltage characteristics of the MWCM. The difficulty is that one cannot access the MWCM at the nanoscale. Another problem is that the LernMatrix has difficulty with practical applications due to the sparsity requirements of the key and value space. The present invention solves both of these problems using a microwire/nanowire grid, as described more fully hereinafter.

An Implementation of the LernMatrix with the MWCM

Each conducting junction in the MWCM according to the present invention represents a first logic state (logical 1) in the LernMatrix; conversely, each non-conducting junction represents a second logic state (logical 0). The key required to store and recall the value is applied as a voltage to the key nanowires of the MWCM. During storage, the value to be associated with the key is applied to the value nanowires as a voltage, such that the potential difference between the key nanowires and the value nanowires that are assigned as 1 is sufficient to convert a non-conducting junction into a conducting junction, thus storing the information into the MWCM. During recall, if the exact key is applied to the key nanowires of the MWCM (assuming nothing else has yet been stored), a current will be read-out at each of the value nanowires proportional to the number of key nanowires connected to it. Accordingly, the invention provides a mechanism that is well-suited to implement the LernMatrix.

As more fully described hereinafter, the present invention further solves two remaining problems regarding accessing the nanowires on the MWCM and overcoming the difficulty of sparsity inherent with use of the LernMatrix.

Microwire/Nanowire Grid

Figure 6:
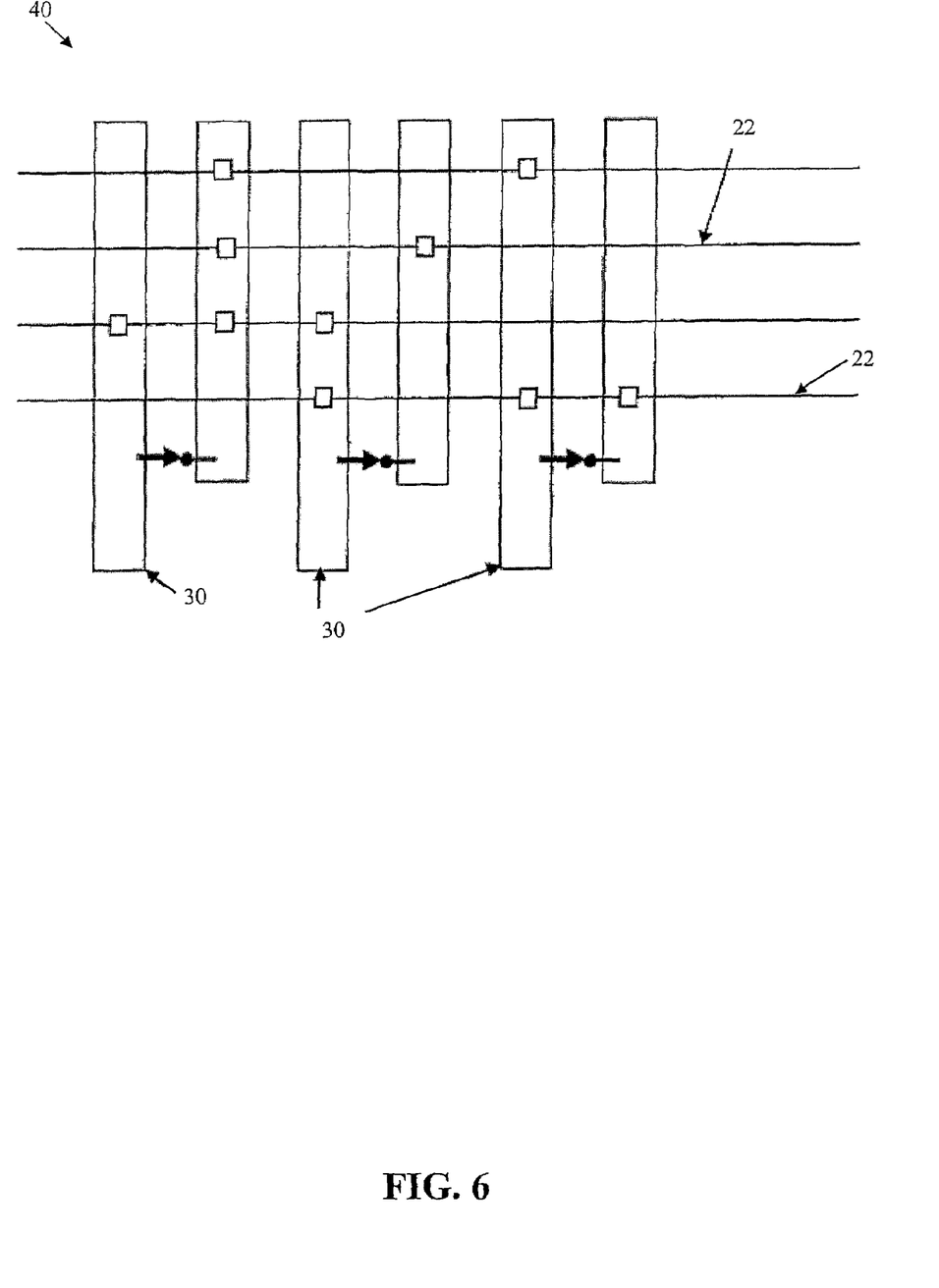
FIG. 6 is a schematic view a microwire/nanowire grid, according to an embodiment of the present invention.

To solve both of these problems simultaneously, the present invention provides a microwire/nanowire grid (MNG) 40, with microwires 30 running in one direction crossing the nanowires 22 that are extended from the MWCM as illustrated in FIG. 6. Each crossing of a microwire and a nanowire may form a junction or may not connect. The probability that a junction is formed is specified during fabrication, and is independent of whether any surrounding crossings form junctions. In contrast to a demultiplexer in which the probability that a junction forms is specified such that each nanowire can be independently selected with at least one address, the associative memory of the present invention maps every possible key to a different set of nanowires. The number of nanowires in this set should maximize the storage capacity of the memory.

The microwire farthest from the MWCM can be used to drive the potential of the microwires high for the key side and low for the value side (or vice-versa). Unless another microwire connected to a particular nanowire is inactive, then that nanowire will remain active. (See FIG. 4.) Solely for ease of presentation herein, but without implying any limitation on the present invention, its assumed here that key side of the MWCM is active-high, and the value side of the MWCM is active-low (they must be complementary). Thus, the terms active and selected and logical 1 means that a high potential when used in reference to the key side of the associative memory and low potential when used in reference to the value side of the associative memory.

In the microwire/nanowire grid according to the present invention, a nanowire is selected when none of the junctions along the nanowire has a potential difference across it. Thus, a nanowire will conduct if it does not have a junction at each crossing with a logic 0 microwire. If there are P total microwires with A of them being logic 1 and the probability that a crossing contains a junction is r, then the probability that a particular nanowire will be selected by a random address will be $(1-r)^A$. The expected number of nanowires that are selected by a given set of microwire potentials, therefore, is $N \cdot (1-r)^A$. A potential difficulty here is that the expected number of selected nanowires depends on the number of high-potential microwires. If for instance the microwire potentials are 111 . . . 11, then the expected number of selected nanowires is N. This representation is not entirely satisfactory, though, because the LernMatrix performs more satisfactorily when the number of number of 1s in the address is the same (or at least similar) for all key-value pairs stored in the memory.

According to the present invention, this problem can be addressed by making the number of high-potential microwires a constant. This is accomplished by requiring adjacent microwires to be complementary, as illustrated in FIG. 6, but other approaches are possible. This requirement ensures that exactly P/2 microwires are high for each address. Accordingly, to have on average B selected nanowires, the probability that the junction forms, r, is $$r = 1 - \sqrt[P/2]{B/N}.$$

The analysis of the value microwire/nanowire grid is similar, except that the polarity is reversed (high potential becomes low potential and vice versa).

Thus, the present invention further provides for accessing the MWCM using lithographically placed microwires, and provides a mapping from the possible microwire potential space to the nanowire space. Because of the symmetry of the microwire/nanowire grid, all sets of microwire potentials are symmetric. This means that the entire set of microwire potentials can be used—there is no restriction regarding using a particular subset of keys and values in order to get the associative memory to work. A simple mathematical analysis shows that the number of nanowires selected by any given set of microwire potentials follows a binomial distribution with mean of B.

Learning

In learning mode, a voltage (or other stimulus signal) necessary to reconfigure the MWCM junctions is applied to the active key nanowires (via the key MNG) for the first item to be learned. The active value nanowires for this item are grounded (via the value MNG). All inactive key and data lines have a floating potential. The potential difference between the key and value nanowires causes the reconfigurable junctions to become conducting at every junction between them. It can be assumed that the conducting junctions have resistances much higher than the nanowires themselves. Otherwise the voltage will drop across the non-conducting junctions as more junctions switch from conducting to non-conducting, possibly preventing the remaining junctions from becoming conducting. This process is then repeated for each item to be stored. The junctions in the MWCM that become conducting junctions correspond to entries in the LernMatrix equal to 1.

Reading Out Values from the Grid

In order to readout the values from the grid, two functional tasks are accomplished: First, the LernMatrix operation of decoding the currents on the value-side nanowires into the most-likely set of nanowires is performed. Then, the microwire value most likely to encode into that set of nanowires is determined. These tasks initially appear quite difficult, especially considering the problems that can arise if there are errors due to overfilling the LernMatrix. However, a simple technique, according to the present invention, can be used that works on the principle that the microwires connecting to the value-side MNG are complementary.

While learning a particular key-value pair, the nanowires selected by the value-side MNG are fully connected to the key-side nanowires in the crossbar memory. The value-side nanowires that were selected are, by design, not connected to any microwire that was logic 0 during training of this key-value pair. Thus, any current that may flow in this microwire is due to connections formed in the MWCM by extraneous items stored in memory. On the other hand, a microwire that was logic 1 during training of a particular key-value pair is likely to be connected to at least some of the nanowires selected during learning. The current flowing through the selected value-side nanowires, which are fully connected to the selected key-side nanowires, will be large. Hence, one would expect that a microwire that was logic 1 (grounded) during the learning of a particular key-value pair would draw more current than a microwire that was logic 0 (ungrounded). Therefore, the method used to choose which one of a complementary pair of nanowires on the value side corresponds to a given key is to choose the microwire that draws the most current.

Figure 7:
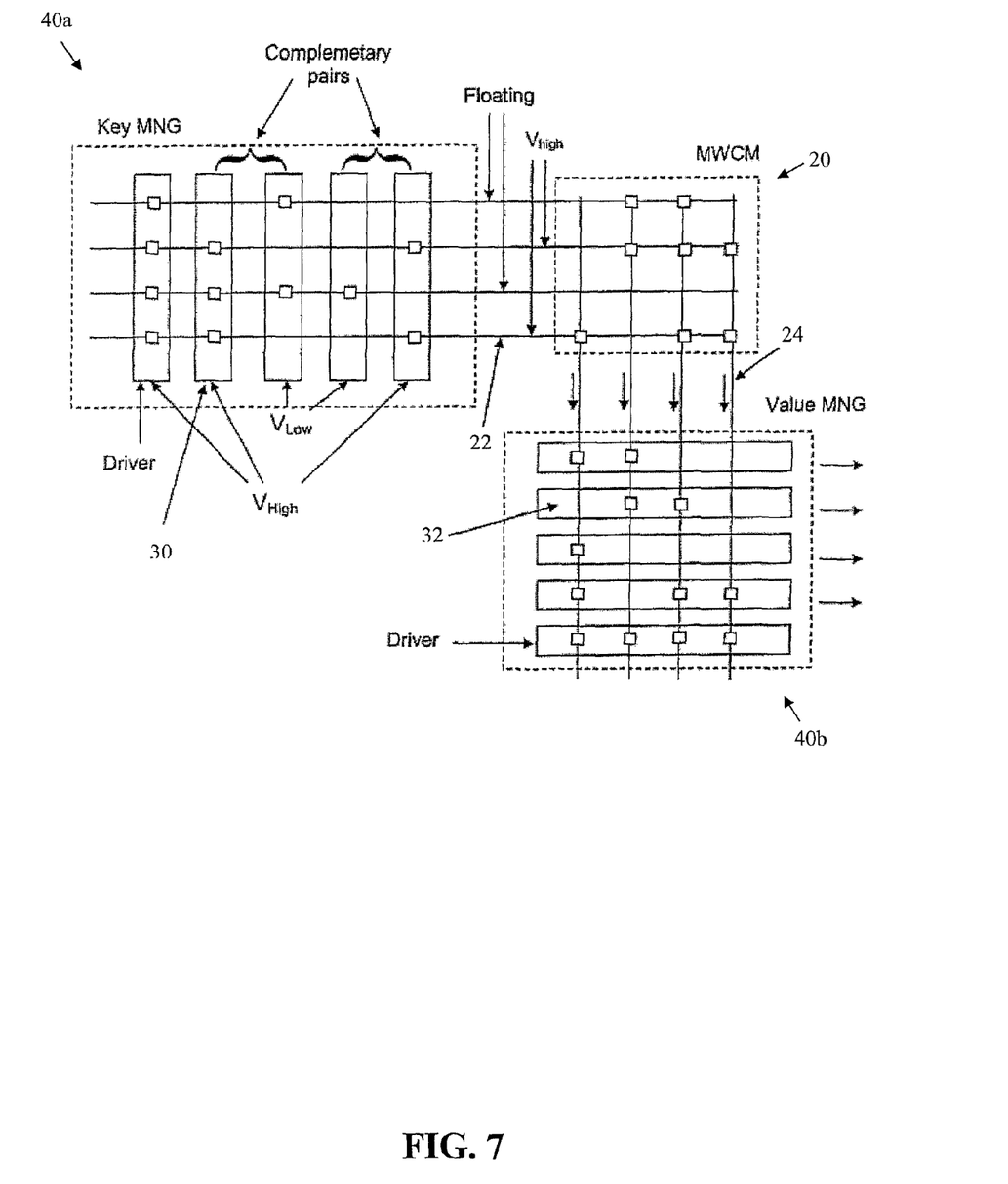
FIG. 7 is a schematic view a nanoscale CAM in readout mode, according to an embodiment of the present invention.

FIG. 7 illustrates the operation of this aspect of the present invention. As illustrated the cross array of nanowires 20 defines a MWCM that is connected to a first MNG 40a, defining a key MNG. More particularly, a set of nanowires 22, defining key nanowires, crosses with a set of macrowires 30 belonging to the key MNG. Similarly, the MWCM is also connected to a second MNG 40b, defining a value MNG, the connection being effected by the crossing of another set of nanowires 24, defining value microwires, with another set of macrowires 32, defining value macrowires belonging to the value MNG. As illustrated, the current these microwires draw is measured, according to the present invention, while all of the other value-side microwires are disconnected to maximize the current flow through these microwires.

Abstract Model of a NanoCAM

FIG. 7 also illustrates the essential signal transformations performed in a NanoCAM. Each block of the NanoCAM—the two MNGs and the MWCM—can described by a multi-dimensional mapping between the inputs and outputs of the block. The two modes of operation (storage and readout) will have different, but related, composition of mappings. During storage one can define each block by a mapping. The mapping performed by the key MNG from the key microwires to the key nanowires is $A:(0,1)^{L_1} \to (0,1)^{N_1}$, i.e. A maps an $L_1$-dimensional binary input to a much larger $N_1$-dimensional binary output. The mapping performed by value MNG during storage from the value microwires to the value nanowires is $B:(0,1)^{L_2} \to (0,1)^{N_2}$ where $N_2$ is also much larger than $L_2$. The MWCM performs the storage operation, which is not a static mapping since it changes over time, as more items are stored in the CAM. However, the storage operation is simply the sum of each outer-product of the projected inputs and outputs. The mechanism can be described by an iterative equation $$M_i = M_{i-1} \vee A(x_i) \cdot B(d_i)^T,$$

$$M_0 = 0,$$

where $x_i$ and $d_i$ are the $i^{th}$ key and value pair stored in the memory.

During readout, the connections in the MWCM become fixed, and MWCM performs a simple matrix multiplication between the binary valued voltage at the key nanowires, and the current available on the value nanowires. Since there are an integer number of connections, and assuming that all connections have an identical resistance, the current available on the value nanowires is an integer multiple of some baseline current defined as having a unit value of 1.

For the readout operation, the same mapping of A on the key MNG is used, but now there is the additional mapping of the MWCM, which is $M: (0,1)^{N_1} \to \mathbb{Z}^{N_2}$. The mapping M is simply the output of the LernMatrix prior to thresholding. Since it is linear, it can be expressed as a matrix multiplication. The value MNG operates in different mode from the store mode: the inputs and outputs are reversed, and now the inputs are integer-valued currents instead of voltages, so its mapping becomes a contraction from a large dimensional $N_2$ to a lower dimensional $L_2$ space, $R: \mathbb{Z}^{N_2} \to (0,1)^{L_2}$. Thus, the readout operation can be described by the functional composition of the three NanoCAM components:

$$y_i = (R \circ M A)(x_i).$$

If only one item is stored in the CAM, say, the first item then $$M_1 = B(d_1) \cdot A(x_1)^T.$$

Additionally, if B is assumed to be one-to-one (which is possible, but not guaranteed), then $B^{-1}$ exists over the domain $\{B(y) | y \in (0,1)^{L_2}\}$. Also, assume that $A(x_1)$ is non-zero. If R is chosen to be a step function, followed by $B^{-1}$, then $$(R \circ M_1 A)(x_1) = \lfloor R \circ B(d_1) \cdot A(x_1)^T A \rfloor(x_1)$$
$$= R[B(d_1) \cdot \|A(x_1)\|^2]$$
$$= (B^{-1} \circ u)[B(d_1) \cdot \|A(x_1)\|^2]$$
$$= B^{-1}[B(d_1)]$$
$$= d_1$$

where u(x) is a multidimensional threshold function with a threshold of 1. Thus, the readout will exactly be the value stored in this case. It should be noted upon examination of the functional components that the readout function R provides for the thresholding mechanism required for the LernMatrix in addition to the inverse operation of the functional mapping B.

Nonlinear projections to high dimensional spaces similar to ones utilized in signal processing and pattern recognition (kernel methods) can also be utilized according to the present invention. Here, however, an objective is enabling the projection, so its properties are analyzed based on the process design assumptions. It is believed that, by going through this more complex route, the overall memory characteristics and performance will be better than creating a memory in the original space. In order to evaluate the performance of the NanoCAM, each one of these steps must be modeled and studied in terms of the errors in the process and in the readout strategy. A probabilistic formulation can be used for both the projections and the errors.

Analysis of Performance

The capacity of an associative memory is realized as a trade-off between the amount of information stored in the memory and the ability of the memory to recall this information. Due to the stochastic nature of the connections in both the MWCM array and in the microscale to nanoscale interface, NanoCAM errors during readout are likely. Using Shannon's information theory known to those skilled in the art, however, the NanoCAM can be treated as a communication channel in space (rather than time) and the non-redundant storage capacity can be calculated assuming that the data is augmented with an optimal error correcting code. The redundancy in the optimal code depends on the probability of error of the communication channel (the NanoCAM in this case), so to obtain the capacity, the probability of bit error during readout must be determined.

A formulation of the probability of error during recall given the size of the MWCM and capacity of the memory, along with the parameters of the microwire-nanowire grids (MNGs), is provided in this section. In the derivation, and in the simulated examples that follow, ideal device characteristics as described earlier (e.g., ideal diodes, no noise) are assumed to obtain. From this, a search for the optimal MNG parameters and MWCM capacity that maximizes information storage for a given grid size can be made.

The variables used in this analysis are defined as follows:
$N_1$, $N_2$—number of input and output nanowires in the MWCM, respectively
$B_1$, $B_2$—number of input and output nanowires that are activated during storage of a given key and value, respectively.
C—the number of key-value pairs stored in the CAM.
$q_C$—the capacity utilization, which is the fraction of nanowire crossings in the MWCM that are junctions. In this analysis, it is assumed that some percentage of junctions will be formed due to the storage of other associations in the MWCM, and that these junctions are randomly distributed throughout the array. This number increases with the elements stored in the memory. As this number increases, the probability of error can be expected to increase.

$p_1$, $p_2$—probability that a junction is formed in the key and value MNGs, respectively, $L_1$, $L_2$—number of complimentary pairs of microwires in the key and value MNGs, respectively, $\gamma_1$, $\gamma_2$—probability that a given nanowire is selected for some address (assuming the junction distribution in the MNG is unknown) in the key and value MNGs.

$\beta(n,p,i)$—probability that a binomially distributed random variable of n trails each with a probability of occurring of p equals i.

$$\beta(n, p, i) \equiv \binom{n}{i} p^i (1-p)^{n-i}.$$

Data Storage: Analysis of the Microwire-to-Nanowire Projection

During storage, the key and value MNGs are functionally equivalent, so their behavior can be treated with the same analysis. (Note, however, that the key and value MNGs on performance are quite different). This section contains an analysis of how the MNG parameters affect the functional behavior. This behavior is identified with the mappings A and B, for the key and value MNGs, respectively.

As stated above, the number of nanowires selected by a given key or value is binomially distributed with a mean of $\gamma_i N_i$. This result gives us the expected sparsity of the high-dimensional projection onto nanowires space for a randomly chosen key or value. Additionally, one would like to know the probability distribution of the likelihood that a particular nanowire is chosen. Ideally, all nanowires would be chosen with equal probability, but this is not the case. With the encoding scheme of the present invention, a nanowire may be connected to none, one or both microwires of a complementary pair. As already noted, above, a complementary pair is a logical pair of microwires that always have complementary logic values, such as [0, 1] and [1, 0]. If it is connected to both microwires, the entire nanowire will never be selected. If it is connected to one of the microwires, then that nanowire can only be selected when the address line of the complementary pair is in one state and not the other. If neither microwire is connected then this address line has no effect on the nanowire. The probability that a nanowire has both connections to a given pair of complementary nanowires is $p^2$. Thus, the probability that a given nanowire does not have both connections on any of the microwire pairs and is thus "always off" is $1-(1-p^2)^L$. Since any nanowire that is connected to both microwires in a pair is never selected and is therefore "always off", one can ignore them in the performance analysis.

The probability that a pair of complementary nanowires has no connection to a given nanowire is $(1-p)^2$, where p is the probability of a connection in the MNG. If the nanowire is not "always off", then the conditional probability that there are no connections becomes $$a = \frac{(1-p)^2}{1-p^2} = \frac{1-p}{1+p}.$$

Since all of the connections are independent, the number of microwire pairs, R, connected to the nanowire will be binomially distributed over L possible connections each with probability a, or $Pr[R=r]=\beta(L,a,r)$, given that the nanowire is not "always off". The number of addresses (out of a possible $2^L$ addresses) that will select that nanowire is then $2^R$.

Consider that for a given address of a MNG, the probability that a given nanowire is selected is equal to $\overline{B}/N$. This is by design. However, this assumes nothing is known nothing about the nanowire. Some nanowires are selected by a larger number of addresses than others, and it is possible that some are not selected by any address. Since it is not known which nanowires these are, $\overline{B}/N$ still holds true. But if it is known that a nanowire has been selected before, then the probability that it will be selected again by another independently chosen address is not $\overline{B}/N$, but something larger.

This conditional probability is important for the key encoding performed of the MNG. Here, the probability that a given nanowire will be chosen again, given that it is already chosen, is needed because the expected number of times that the selected input nanowire was selected by other keys stored in this memory is, in turn, needed. This is the important probability needed to calculate the density of the current due to the storage of other memory elements.

Given that a nanowire is selected by a given address, then the distribution of R changes: Firstly, the nanowire cannot be "always off". Secondly, nanowires with a large number of addresses are more likely to have been selected than nanowires with few addresses. This distribution can be determined using the Bayes decision rule, weighting $Pr[R=r]$ by the likelihood that a particular address is selected. Thus, $$Pr[R=r \mid S] = \frac{1}{n} \beta(L, a, r) \cdot 2^r$$

where n is normalization factor needed to ensure that the probability distribution sums to 1. This expression simplifies to (5) as shown in the appendix.

$$Pr[R=r|S]=\beta(L,1-p,r).$$

Now the likelihood that a given nanowire with R connections is selected by a given address is simply $$\frac{2^r}{2^L} = 2^{r-L},$$

when R=r. Thus, the total likelihood that a given nanowire is selected by a given address, given that it has already been selected by another address is:

$$\alpha = \sum_{r=0}^{L} \beta(L, 1-p, r) \cdot 2^{r-L}$$

$$= \left(1 - \frac{p}{2}\right)^L.$$

This is in contrast to the likelihood that a given nanowire is unconditionally selected, which is $\gamma = \overline{B}/N = (1-p)^L$. Solving for p in terms of $\gamma$, yields $$p = 1 - \sqrt[L]{\gamma}.$$

Upon substitution for p in terms of $\gamma$ $$\alpha = \left[1 - \frac{(1 - \sqrt[L]{\gamma})}{2}\right]^L$$

In the limit as L goes to infinity, the expression simplifies to $$\lim_{L \to \infty} \alpha = \sqrt{\gamma}$$

For the value encoding, it is the opposite conditional probability that is of interest: it is desirable to know the probability of selecting a given nanowire given it was not selected by the given address. This is because on the value side, errors will result from choosing the same key nanowire, but a different value nanowire. This probability should be less than the unconditional probability, which is good.

Since the probability distribution of R given some event is known, the unconditional probability distribution of R is known, and the probability that the event occurs is known, Bayes's rule can be used to calculate the probability distribution of R give that some event does not occur. Call this value $\omega$, and solve in terms of $\gamma$ $$\omega = \frac{\gamma - \gamma \left(\frac{1 + \sqrt[L]{\gamma}}{2}\right)^L}{1 - \gamma} \text{ and}$$

$$\lim_{L \to \infty} \omega = \frac{\gamma}{1 + \sqrt{\gamma}}.$$

With this knowledge, q, the probability that an interfering junction in the MWCM has been formed due to the storage of another key-value pair can be calculated. Assume that two values have been stored in the associative memory: the one being the one to be recalled and another value independent of the one being recalled. The value q is a probability that one of the junctions between the selected input nanowires and unselected output nanowires of the key-value pair is the one to be recalled. The probability that the other stored key also selected the given selected input nanowire will be $\alpha \approx \sqrt{\gamma} = \sqrt{B_1/N_1}$. The probability that a given unselected output nanowire was also selected by the other stored value will be $$\omega \approx \frac{\gamma}{1 + \sqrt{\gamma}} = \frac{B_2/N_2}{1 + \sqrt{B_2/N_2}}.$$

Thus the probability that a given junction has formed during the storage of the other key-value pair on the selected input nanowire and unselected output nanowire is $$q_2 \approx \alpha \cdot \omega = \sqrt{B_1/N_1} \cdot \frac{B_2/N_2}{1 + \sqrt{B_2/N_2}}.$$

If instead of the two key-value pairs, C pairs are available, then the probabilities get much more complicated since many more possibilities need to be looked at, and a succinct answer is not available. However, the probability that a junction is not formed as the product of the probabilities that they have not formed for each other element can be approximated, or $$q_C = 1 - (1 - q_2)^{C-1}.$$

This approximation results in a $q_C$ that is larger than what occurs in simulation.

Data Retrieval: Analysis of the Molecular Crossbar Projection

During recall, the key is applied as a set of potentials to the key MNG, and the same key nanowires activated during storage of that key-value pair will be activated again. These nanowires will be fully connected to the value nanowires activated during storage and additionally, they will be connected to some other output nanowires due to the connections formed during the storage of other memory items. Were all of the nanowires grounded using the value MNG, then a set of currents on the value nanowires would be obtained. This operation can be treated as a projection that takes place in the MWCM during readout between the key nanowire voltages and the value nanowire currents. These currents are then read using the readout mechanism analyzed next. The strategy for analyzing the readout is to assume that the number of nanowires selected during storage on both the key and value sides of the memory is known. Then these values can be averaged later to find the probability of error for the entire system.

The key nanowires $\tilde{x}$ values serve as a voltage input to the transformation M, and the value nanowires $\tilde{y}$ serve as the current output. Since this operation is linear, the projection can be represented as the matrix multiplication, $\tilde{y} = M\tilde{x}$. In order to analyze this projection separately from the MNG projections, assume that the key and value nanowire patterns applied to the MWCM during storage are known. The key nanowires had the same value during storage as they do during readout. The value nanowires had a set of voltages applied during storage for this particular memory item, say $\tilde{d}$. This operation is identical to the LernMatrix readout operation. Average over all possible inputs and outputs later in the analysis to account for all possible projected key and value nanowire patterns.

Assume that the key nanowire pattern $\tilde{x}$ is known and has $B_1$ active nanowires. Now, since only the connections to the active nanowires can contribute to the output, the problem is greatly simplified. For the value nanowires that were active during storage, there will be a connection to every active key nanowire. Thus, the normalized current on these nanowires is simply $B_1$ regardless of whatever else is stored in the Nano-CAM. The current on the value nanowires that were not selected, however, may be connected to the active nanowires by connections formed during the storage of other memories. The probability that they were connected is simply $q_C$, which was derived in the previous section. Since it is assumed that the probability is independent and identically distributed for each connection, the total number of connections on a given value nanowire is then binomially distributed with the distribution $\beta(B_1, q_C, i)$, where i is the number of connections. Because of the independence of the connections, the number of connections on all of the unselected nanowires will be independent and drawn from the same distribution. The total normalized current leaving each of the value nanowires is simply the number of these connections.

In summary, the output of this projection $\tilde{y}$ is simply $B_1$ for each nanowire where $\tilde{d}$ is active, and $\beta(B_1, q_C, i)$ for the other value nanowires, or $$P(\tilde{y}_k = i) = \begin{cases} \delta(i - B_1), & \tilde{d}_k = 1 \\ \beta(B_1, q_C, i), & \tilde{d}_k = 0 \end{cases},$$

where $\tilde{y}_k$ and $\tilde{d}_k$ are the current during readout and voltage during storage of the $k^{th}$ nanowire.

Data Retrieval: Analysis of the Value Nanowire-to-Microwire Projection

Of course, there is no way to measure the individual output nanowire currents—one must resort to an indirect method of readout. The proposed readout is local to each complementary pair of value microwires: for each pair, ground each of the microwires individually and compare the two currents. The microwire with the higher current is more likely to have been grounded during storage. This explanation indicates that one will be right more often than not when guessing the value, but there may be better ways to read the information out. What it is desirable to know is how often one is wrong (the probability of bit error). This corresponds to behavior of the mapping y=R(ỹ).

In analyzing this behavior, once again assume that the values of ỹ current in each of the value nanowires is known, which is ỹ, the desired value d. Since the rule for determining the value based on which microwire in each complementary pair has the higher current, one simply needs to calculate the current on the two microwires. The current on the microwire grounded during storage is $I_g$, and the current on the microwire pulled high during storage is $I_u$. When $I_g$ is greater than $I_u$, a correct decision is made. Because the connections formed in the MNG are independent, it is expected that the currents on the microwires are to be relatively independent. This is not entirely true, however, but it is a good approximation if there are a large number of microwire pairs. (A counterexample is the case where there are only two pairs of microwires and one of the ungrounded microwires is not connected to any nanowire: the other ungrounded microwire must be connected to all of the unselected nanowires.)

The expected current on the microwires during read-out is simply the sum of all of the nanowire currents that connect to it. Thus, in order to find out the current on the two microwires, simply count the number of nanowires that are active and inactive and that connect to each of the two microwires. So, there are four cases to consider: 1) the number of active nanowires connections to grounded microwires, $k_{ga}$; 2) the number of inactive nanowires connected to ungrounded microwires, $k_{gi}$; 3) the number of active nanowires connected to ungrounded microwires, $k_{ua}$; and 4) the number of inactive nanowires connected to ungrounded microwires, $k_{ui}$.

The number of connections between the grounded microwire and the active nanowires is simple. Since the connections on the grounded microwire had no effect on the selection of which nanowires were to become active, the probability that a given inactive nanowire is connected to the grounded microwire is simply $p_2$. Since there are $B_2$ active nanowires, the distribution of the number of connections must be binomial out of $B_2$ possible connections, each with probability $p_2$, or $$P(k_{ga}=i)=\beta(B_2,p_2,i).$$

The number of connections between the grounded microwire and the inactive nanowires is similar, except that now there are $n_2-B_2$ possible connections. Therefore, the distribution of the number of connections is binomial out of $n_2-B_2$ possible connections, each with probability $p_2$, or $$P(k_{gi}=i)=\beta(n_2-B_2,p_2,i).$$

However, since the connections ungrounded microwire determines which nanowires are active, the probabilities change, even though there were $p_2$ when they formed. This is simple to see since any nanowire connected to an ungrounded microwire is guaranteed to be inactive. Thus, $k_{ua}=0$. But it is known that the expected number of connections between the ungrounded and grounded microwires are the same value: $p_2 B_2$. Also, among the inactive nanowires, all of the probabilities of connections must be the same: so the resulting probability distribution must be binomial among the $n_2-B_2$ inactive nanowires. Therefore, the probability of each connection between the ungrounded microwires and the inactive nanowires must be $$\frac{n_2 p_2}{n_2 - B_2},$$

and the distribution is then $$P(k_{ui} = i) = \beta\left(n_2 - B_2, \frac{n_2 p_2}{n_2 - B_2}, i\right).$$

The total normalized current $I_g$ comprises two components: the current due to the active nanowires $I_{ga}$ and the current due to the inactive nanowires, $I_{gi}$. Since the current on the active nanowires is always $B_1$, $I_{ga}=B_1 k_{ga}$. The probability distribution is $P(I_{ga}=B_1 i)=\beta(B_2,p_2,i)$.

The current $I_{gi}$ is a sum of $k_{gi}$ binomial random variables each with the distribution $\beta(B_1,q_C,i)$. This result can be found by convoluting $\beta(B_1,q_C,i)$ with itself $k_{gi}$ times, where $k_{gi}$ is also a random variable. An easier way to calculate this is to realize that the normalized current $I_{gi}$ is the same as the total number of connections in the MWCM between the active key nanowires and the $k_{gi}$ inactive value nanowires that are connected to the grounded microwire. This is a total of $B_1 k_{gi}$ MWCM junctions each forming a connection with a probability of $q_C$. So, given the value of $k_{gi}$, $$P(I_{gi}=j|k_{gi})=\beta(B_1 k_{gi},q,j).$$

Averaging over the possible values of $k_{gi}$, $$P(I_{gi} = j) = \sum_{k_{gi}=0}^{n_2-B_2} \beta(n_2 - B_2, p_2, k_{gi})\beta(B_1 k_{gi}, q_C, j).$$

The total current seen on the grounded microwire Ig is simply the sum Iga and Igi. The distribution of $I_{ga}$ is then a convolution of the two independent distributions, which yields the ungainly result of $$P(I_g = i) = \sum_{\forall j} P(I_{ga} = i - j)P(I_{gi} = j)$$

$$= \sum_{\forall j \ni B_1|j} \sum_{k_{gi}=0}^{n_2-B_2} \beta(n_2 - B_2, p_2, k_{gi})$$

$$\beta(B_1 k_{gi}, q_C, i - j)\beta(B_2, p_2, j/B_1)$$

The current on the grounded microwire due to the inactive nanowires is due to similar factors as the current on the ungrounded microwire. Since the connections on the grounded microwire had no effect on the selection of which nanowires were to become active, the probability that a given inactive nanowire is connected to the grounded microwire is $p_2$ (the same for the active nanowire). The number of possible inactive nanowires is again $n_2-B_2$. Thus, the number of inactive nanowires connected to the microwire $C_b$ is binomially distributed out of a possible $n_2-B_2$ connections each with probability $p_2$.

The current on the ungrounded microwire $I_u$ is only due to the connections to the inactive nanowires, since it cannot connect to the active nanowires. The resulting current distribution is found in a similar way to the current $I_{gi}$:

$$P(I_u = j) = \sum_{k_{ui}=0}^{n_2} \beta\left(n_2 - B_2, \frac{n_2 p_2}{n_2 - B_2}, k_{ui}\right) \beta(B_1 k_{ui}, q_C, j),$$

Now that the independent distributions of the grounded and ungrounded microwire currents have been obtained, one can calculate the probability that the ungrounded current is greater than the grounded current given $B_1$ and $B_2$, which is the probability that our decision rule results in an error. This is given by $$P_{err}(B_1, B_2, q_C) = P(I_g \le I_u)$$
$$= \sum_{\forall i} \sum_{j \ge i} P(I_g = i) P(I_u = j)$$

To make things more complicated, $B_1$ and $B_2$ are both hidden random variables, so one must average over both of them to get the final result for the probability of bit error for a given memory with a given capacity utilization q.

$$P_{err}(q_C) = \sum_{\forall B_1} \sum_{\forall B_2} P_{err}(B_1, B_2, q_C) \beta\left(\frac{N_1, \overline{B}_1}{N_1, B_1}\right) \beta\left(\frac{N_2, \overline{B}_2}{N_2, B_2}\right)$$

The above equation is extremely expensive to calculate, and it is difficult to gain insight into how each parameter will affect over all performance. One approach to simply this result is to try to approximate the random variable $I_{diff}$ with a Gaussian distribution. This is a reasonable approach because for many values of $B_1$, $B_2$ and $q_C$ the distribution of $I_{diff}$ (which is a convolution of binomial distributions) will resemble a Gaussian. But, for some values, the approximation will be invalid, and thus this approach does not give results that match the simulated results. However, the approximation, although inaccurate, leads to a better understanding of the effects the parameters have on the error performance of the system. Even with this method, one still needs to average over the distribution of $B_1$ and $B_2$. Taking this approach, yields the following mean and variance for the difference between the current in the grounded and ungrounded read-out microwires (the full derivations are shown in the appendix):

$$E[I_{diff}] = B_1 B_2 p_2 (1 - q_C)$$

$$\text{Var}[I_{diff}] = B_1 p_2 \left\{ \begin{array}{l} \left[B_1 B_2(1-p_2) + q_C(N_2 - B_2)\right] \begin{bmatrix} 1 - q_C + \\ B_1 q_C(1-p_2) \end{bmatrix} \cdots + \\ q_C N_2 \left[1 - q_C + B_1 q_C \left(1 - \frac{N_2 p_2}{N_2 - B_2}\right)\right] \end{array} \right\}.$$

Assuming that $N_2 \gg B_2$, this simplifies to $$\text{Var}[I_{diff}] = B_1 p_2 \{B_1 B_2(1-p_2) + 2q_C N_2[1 - q_C + B_1 q_C(1-p_2)]\})$$

The probability of error for a Gaussian is $Q(\mu/\sigma)$, where $\mu = E[I_{diff}]$, and $$\sigma = \sqrt{\text{Var}[I_{diff}]},$$

and $$Q(x) = \int_x^\infty \frac{e^{x^2/2}}{\sqrt{2\pi}} d\chi.$$

The argument to the Q-function is then:

$$= \sqrt{\frac{B_2^2 \left(1 - \sqrt[L_2]{B_2/N_2}\right)(1 - q_C)^2}{B_2 \sqrt[L_2]{B_2/N_2} + \frac{2q_C N_2(1 - q_C)}{B_1} + 2q_C^2 N_2 \sqrt[L_2]{B_2/N_2}}}$$

Since the Q-function is monotonically decreasing, it is desirable to make the argument as large as possible in order to decrease the error. This means that one would like $\overline{B}_2$ to be large enough so that the term $B_2^2$ in the numerator is large on average, but no so large that $\overline{B}_2$ (the expected value of $B_2$) in the term $$\sqrt[L_2]{B_2/N_2}$$

is close to 1. A larger $N_2$ will allow a larger $\overline{B}_2$ by reducing the effect on the second term. (Of course increasing $N_2$ requires a larger memory, whereas changing $\overline{B}_2$ costs nothing.) Additionally, a smaller $L_2$ will have the same effect on the second term, but decreasing $L_2$ proportionally decreases the information capacity of the NanoCAM. $B_1$ must be made large enough so that the middle term in the denominator does not dominate, but increasing its value beyond that will have a small effect. The other term that clearly negatively affects the error rate is the crosstalk term $q_C$. This term is affected by $B_1$, $B_2$, $L_2$ and $N_2$ and is additionally affected by $L_1$ and $N_1$. The effect of increasing $L_1$ is to decrease the value of $\alpha$ (thereby decreasing $q_C$) until it asymptotically approaches the optimal value of $\sqrt{B_1/N_1}$. Since there is no drawback in increasing $L_1$ theoretically, it should be made very large. Increasing $N_1$ decreases $q_C$, but it the expense of a larger memory.

An interesting case is when there is no "crosstalk" between the elements stored in memory. This occurs when only 1 item is stored in memory. For this case, $I_u=0$ and $I_{gi}=0$, so the only time an error will occur is when $I_{ga}=0$. This can happen quite frequently however. This probability is given by $$Pr[I_c=0]=(1-\gamma_1)^{N_1}+[1-(1-\gamma_1)^{N_1}](1-\gamma_2)^{N_2}+ [1-(1-\gamma_1)^{N_1}][1-(1-\gamma_2)^{N_2}](1-\gamma_2 p_2)^{N_2}$$

and when the size of the memory is reasonably large (as expected), $$\lim_{\substack{N_1 \to \infty \\ N_2 \to \infty}} Pr[I_{ga} = 0] = e^{-\bar{B}_1} + (1 - e^{-\bar{B}_1})e^{-\bar{B}_2} + (1 - e^{-\bar{B}_1})(1 - e^{-\bar{B}_2})e^{-p_2 \bar{B}_2}$$

This yields a lower bound on the error rate that can be expected from the NanoCAM. In particular, the guidelines that $$\bar{B}_1 \text{ and } \bar{B}_2 \left(1 - \sqrt[L_2]{\bar{B}_2/N_2}\right)$$

are much greater than the negative natural log of the desired error rate are obtained.

The present invention can be used in a variety of applications intended to implement high-density computer memories having molecular or nanoscaled components. Accordingly, the invention can be applied to random access memories (RAM), read-only memories (ROM), and a host of similar such devices. More generally, the present invention also provides an interface between microscale components and the ever burgeoning supply of nanoscale components.

EXAMPLES

The above analysis provides a foundation for understanding how each system parameter affects the performance. The following non-limiting examples are intended to convey further characteristics and advantages based on such analysis. The examples, however, are only illustrative. The are not intended to be exhaustive of the various ways of practicing the claimed invention, as will be readily apparent to one skilled in the art having the advantage of the teachings provided herein.

Moreover, the results are only an approximated and are not easily calculated or even estimated. Because of this, Monte-Carlo simulations were used as described below to calculate the performance for a particular set of parameters.

The performance of architecture according to the present invention was simulated by making the following assumptions about the electrical properties of the device: 1) the asymmetric junctions are diodes; 2) the resistance of the crossbar memory diodes dominates all other resistances; 3) the resistance of the driver/nanowire junction greater than or equal to the microwire/nanowire diode junction; and 4) the reverse-bias diode current is 0. The keys and values were chosen from uniform and independent distributions.

To demonstrate the content-addressable nature of the memory, the digits 0-9 as displayed on a seven-segment LED readout were matched with their English spelling, e.g. "three" to the graphic 3, and plotted on a digital readout. One of the difficulties with the digits data is that the seven-bit ASCII keys used to represent the English spellings are highly clustered. For example, the ASCII representations of "five" and "nine" differ only by three bits out of 35. This creates a problem for any associative memory because it effectively reduces the input size in the crossbar memory. This is likely the reason why the digit "9" is aliased by the input "five" in the 1024×256 example in Table 1.

TABLE 1

Example plots of the recall when storing the mapping from the English spelling of each of the digits to its output on a digital LED display.

| Memory Size | Total bits | Example Output |
|---|---|---|
| Desired Output | |  |
| 256 × 64 | 16,384 | |
| 512 × 128 | 65,536 | |
| 1024 × 256 | 262,144 | |
| 2048 × 512 | 1,048,576 | |

Although the performance of the memory in terms of the number of bits needed to store information without error is poor for non-sparse inputs, the memory is quite robust to defects in the memory device itself, even if the defects are introduced after the data has been stored.

The crossbar defect rate is the rate of crossbar diodes that are configured incorrectly. The defective crossbars are chosen randomly. Thus, a defect rate of 50% means that half of the diodes are reversed, and half are correct: This is equivalent to using uniform and independent random weights since, on average, half of the weights will be correct, and half will be wrong in this case as well. Notice that even with an error rate as high as 30%, the digital memory is still able to recall seven digits correctly. If this were a deterministic memory with no redundancy, such an error rate would be expected to produce an error in nine of the ten digits.

Table 2 shows some example plots using the 0-9 digit data described previously.

TABLE 2

Sample digital outputs as crossbar defect rate is increased.

| Diode defect rate | Example Output |
|---|---|
| Desired Output |  |
| 0 | |
| 5% | |
| 10% | |
| 20% | |
| 30% | |
| 40% | |
| 50% | |

A more quantitatively useful simulation is one where random values are stored in the NanoCAM using random keys. The performance of the memory can then be calculated in terms of its ability to store information. Using Shannon's theory, binary data stored in memory has an information content measured in bits. If the data stored is equally likely to be both 0s and 1s, and there are no errors during recall, then the information content is simply the number of bits stored. If recall has a certain probability of error, then one can calculate the total information stored. If the errors are independent and identically distributed, then the recalled information is $$I = -n[p \log_2 p + (1-p)\log_2(1-p)],$$

where n is the number of bits and p is the probability of error. The quantity of information stored in the CAM is then $$I_{CAM} = -CL_2[P_{err} \log_2 P_{err} + (1-P_{err})\log_2(1-P_{err})].$$

It is possible to compare the information recall of the NanoCAM to the information recall of a conventional binary memory, where the information is simply the number of elements stored times the number of bits in each element. Ideally, one would optimize the parameters for a given memory size such that the information is maximized using a global search procedure, but here some values of some of the better information storage potentials are given.

In applications using nanotechnology, a high error rate in the components of the memory should be suspected. One can then compare the performance of the NanoCAM when some of the memory elements in the MWCM have errors to a conventional memory with errors. As errors are introduced, the performance of both memories will decrease, but usually the performance of the NanoCAM decreases slower than the conventional memory. These results are shown in Table 3. The efficiency is the ratio between the quantity of information stored in the NanoCAM to the quantity of information stored in a conventional memory of the same size as the MWCM. Both memories have the same defect rate.

TABLE 3

Monte-Carlo simulation results of the NanoCAM using random data with defects in the molecular-wire crossbar memory.

| $N_1$ | $N_2$ | $\overline{B}_1$ | $\overline{B}_2$ | $L_1$ | $L_2$ | C | MWCM Defect rate | Capacity (bits) | $P_{err}$ | Information (bits) |
|---|---|---|---|---|---|---|---|---|---|---|
| 300 | 300 | 5 | 60 | 100 | 80 | 50 | 0% | 4000 | 35% | 243 |
| 300 | 1000 | 5 | 250 | 200 | 100 | 70 | 0% | 7000 | 32% | 700 |
| 300 | 3000 | 5 | 600 | 200 | 110 | 90 | 0% | 9900 | 27% | 1547 |
| 300 | 300 | 5 | 60 | 100 | 80 | 50 | 10% | 4000 | 38% | 167 |
| 300 | 1000 | 5 | 250 | 200 | 100 | 70 | 10% | 7000 | 34% | 512 |
| 300 | 3000 | 5 | 600 | 200 | 110 | 90 | 10% | 9900 | 31% | 1094 |
| 300 | 300 | 5 | 60 | 100 | 80 | 50 | 25% | 4000 | 43% | 56 |
| 300 | 1000 | 5 | 250 | 200 | 100 | 70 | 25% | 7000 | 40% | 210 |
| 300 | 3000 | 5 | 600 | 200 | 110 | 90 | 25% | 9900 | 36% | 574 |

The information (bits) column represents the number of correct bits that can be stored/retrieved assuming a perfect (Shannon) coding to recover the errors. The $P_{err}$ provides the percent of errors in reading a word retrieved from memory. Notice that $P_{err}$ increases slower than the defect rate. The efficiency increases with the number of defects, because the normalizing factor (available memory cells) decreases with the defect rate. The efficiency is very low because of normalizing with respect to the storage of the listing memory with the same capacity. This is a pessimistic number since in order to do so a lot more information is needed in the listing memory. Nevertheless, note that if this percentage is higher than the ratio of micro to nanowires, one is effectively increasing the storage of the equivalent memory created in the micro scale.

It would appear from the simulation that the storage capacity is less than a conventional listing memory implemented in nanoscale components. However, this is a worse case condition since such memories need much more information to be useable (test all the working addresses). There are some clear advantages using the NanoCam memory, however. The associative architecture described herein does not require additional hardware or an address-scanning phase, unlike the Kuekes, et al. implementation. Additionally, this associative memory is inherently defect-tolerant because of the redundancy created at the encoder and decoder, whereas the listing version would require additional hardware (e.g. error-corrective coding) in order to be defect-tolerant. This is crucial because defects are suspected to be a serious problem in molecular electronics. These advantages may outweigh the disadvantage of poor performance if the memory sizes become very large, e.g. $10^6 \times 10^6$ or larger, because the disadvantage of poor performance becomes less of a limitation with increase in memory size, and the advantages become more important.

This invention can be embodied in other forms without departing from the spirit or essential attributes thereof. Accordingly, reference should be made to the following claims, rather than to the foregoing specification, as indicating the scope of the invention.

We claim:

1. A combined content addressable memory device and memory interface comprising:
   at least one molecular wire crossbar memory (MWCM), including
   a plurality of spaced-apart key nanowires,
   a plurality of spaced-apart value nanowires adjacent to the plurality of key nanowires, and
   a plurality of configurable switches positioned between the plurality of key nanowires and the plurality of value nanowires, each configurable switch defining a memory element;
   a key microwire-nanowire grid (key MNG) electrically connected to the plurality of spaced-apart key nanowires; and
   a value microwire-nanowire grid (value MNG) electrically connected to the plurality of spaced-apart value nanowires;
   wherein at least one of the key or value MNGs selects multiple nanowires for a given key or value.

2. The device of claim 1, wherein the plurality of key microwires comprises at least one complementary pair of microwires.

3. The device of claim 2, further comprising a symmetric electrical connection connecting the key nanowires and the at least one pair of complementary key microwires.

4. The device of claim 1, wherein the plurality of value microwires comprises at least one complementary pair of microwires.

5. The device of claim 4, further comprising a symmetric electrical connection connecting the value nanowires and the at least one pair of complementary value microwires.

6. The device of claim 1, wherein the memory element comprises a reconfigurable switch.

7. The device of claim 1, wherein the memory element comprises a bi-stable molecule.

8. The device of claim 1, wherein a predefined combination of spaced-apart key nanowires define a set of memory keys, and wherein each of the memory keys corresponds to one and only one combination of the key nanowires.

9. The device of claim 1, wherein a predefined combination of spaced-apart value nanowires define a set of memory values, and wherein each memory value corresponds to one and only one combination of the value nanowires.

10. The device of claim 1, wherein the at least one MWCM is configured to implement a LernMatrix.

11. The device of claim 1, wherein one of the microwires is positioned at a distance farther from the MWCM than that of each other microwire, and wherein the microwire so positioned electrically drives each of the other microwires during a memory readout operation.

12. A content addressable memory device comprising:
a first plurality of nanowires configured to define key nanowires;
a second plurality of spaced-apart nanowires spaced apart from and extending substantially perpendicular to the first plurality of spaced-apart nanowires and configured to define value nanowires; and
a plurality of reconfigurable switches positioned between the plurality of key nanowires and the plurality of value nanowires, each reconfigurable switch defining a memory element;
wherein the memory device performs a plurality of different LernMatrix operations in response to an electrical signal.

13. The memory device of claim 12, wherein the memory element comprises a bi-stable molecule.

14. The device of claim 12, further comprising a symmetric electrical connection connecting the key nanowires to at least one pair of complementary key microwires.

15. The device of claim 12, further comprising a symmetric electrical connection connecting the value nanowires to at least one pair of complementary value microwires.

16. A memory interface for interfacing with a nano-scaled memory device, the interface comprising:
a first microwire-nanowire grid (MNG) configured to define a key MNG that can electrically connect with a plurality of spaced-apart key nanowires; and
a second MNG configured to define a value MNG that can electrically connect with a plurality of spaced-apart value nanowires;
wherein the interface provides data signals to and receive data signals from the nano-scaled memory device by implementing a plurality of LernMatrix operations in response to an electrical signal.

17. The interface of claim 16, wherein the plurality of key microwires comprises at least one complementary pair of microwires.

18. The device of claim 16, wherein the plurality of value microwires comprises at least one complementary pair of microwires.

19. A method for operating a memory device configured to implement a LernMatrix, the method comprising:
providing a microwire/nanowire grid;
during a learning mode, reconfiguring junctions within the microwire/nanowire grid; and
reading out data from the memory device by performing a LernMatrix decoding operation and determining which microwires within the microwire/nanowire grid are most likely to encode into a set of nanowires contained in the microwire/nanowire grid.

20. The method of claim 19, further comprising supplying a voltage to at least one key nanowire contained in the microwire/nanowire grid such that the potential between the at least one key nanowire and a corresponding at least one value nanowire also contained in the microwire/nanowire grid causes a corresponding non-conducting junction between the at least one key nanowire and at least one value nanowire to conduct an electrical current.

* * * * *